United States Patent [19]
Shih et al.

[11] Patent Number: 5,943,569
[45] Date of Patent: Aug. 24, 1999

[54] METHOD FOR MAKING IMPROVED CAPACITORS ON DYNAMIC RANDOM ACCESS MEMORY HAVING INCREASED CAPACITANCE, LONGER REFRESH TIMES, AND IMPROVED YIELDS

[75] Inventors: Cheng-Yeh Shih; Yuan-Chang Huang, both of Hsin-Chu; Chue-San Yoo, Pao-San Hsiang; Wen-Chan Lin, Hsin-Chu, all of Taiwan

[73] Assignee: Taiwan Semiconductor Manufacturing Company, Ltd, Hsin-Chu, Taiwan

[21] Appl. No.: 08/880,854

[22] Filed: Jun. 23, 1997

[51] Int. Cl.⁶ .............................................. H01L 21/8242
[52] U.S. Cl. .......................................... 438/253; 438/657
[58] Field of Search ................................. 438/253, 396, 438/488, 491, 657

[56] References Cited

U.S. PATENT DOCUMENTS 5,438,012  8/1995  Kamiyama ............................... 437/60
5,438,019  8/1995  Sandhu .................................. 437/101
5,744,387  4/1998  Tseng ................................... 438/253
5,766,993  6/1998  Tseng ................................... 438/253

*Primary Examiner*—Chandra Chaudhari
*Attorney, Agent, or Firm*—George O. Saile; Stephen B. Ackerman

[57] ABSTRACT

A method for making improved capacitor bottom electrodes (capacitor nodes) having longer refresh cycle times and increased capacitance for DRAM cells has been achieved. The method involves using a polysilicon high-temperature film (HTF) instead of the conventional doped polysilicon to form the node capacitors. After forming the DRAM pass transistors (FETs) and depositing an insulating layer, node contact openings are etched in the insulator to the drain of the FET. The capacitor bottom electrodes are formed by depositing a polysilicon HTF at a temperature of at least 650° C. using a reactant gas mixture of $H_2/SiH_4/PH_3$, which results in a longer refresh cycle time and increased capacitance. This results in a significantly improved final die yield. After forming an interelectrode dielectric layer on the bottom electrodes, another doped polysilicon layer is deposited to form the top electrodes to complete the DRAM cells.

22 Claims, 3 Drawing Sheets

METHOD FOR MAKING IMPROVED CAPACITORS ON DYNAMIC RANDOM ACCESS MEMORY HAVING INCREASED CAPACITANCE, LONGER REFRESH TIMES, AND IMPROVED YIELDS

BACKGROUND OF THE INVENTION (1) Field of the Invention

The present invention relates to the fabrication of dynamic random access memory (DRAM) devices, and more particularly to a method for fabricating improved bottom electrodes (capacitor nodes) using high-temperature film (HTF) polysilicon for increased capacitance and improved cycle refresh times and product yield.

(2) Description of the Prior Art

Dynamic random access memory (DRAM) devices are used for storing digital information. The DRAM consists of an array of memory cells which are accessed by peripheral circuits on the chip for randomly reading and writing information to and from the individual memory cells. The most common memory cell consists of a single-current pass transistor, typically a field effect transistor (FET), and a single storage capacitor. With increased circuit density and reduced cell size, the capacitor area decreases, and it is important in the DRAM technology to maintain or increase the capacitor area while reducing the leakage current to provide sufficient signal-to-noise margins and to increase the refresh cycle times.

Recently, stacked storage capacitors have drawn considerable attention because they can be built vertically upward over the FETs in a variety of ways to substantially increase the surface area of the capacitors. However, these stacked capacitors require additional processing steps and are more costly to manufacture, compared to the more conventional process that uses a flat stacked capacitor structure.

One method of increasing capacitance on stacked capacitors is to use an interelectrode dielectric layer having a high dielectric constant between the capacitor electrodes. For example, Kamiyama in U.S. Pat. No. 5,438,012 teaches a method of forming a doped tungsten oxide as the interelectrode dielectric layer to increase capacitance and reduce leakage currents by reducing the dangling bonds in the dielectric. Kamiyama dopes the tungsten oxide with titanium and also suggests other dopants, such as silicon, boron, phosphorus, or germanium.

Sandhu in U. S. Pat. No. 5,438,019 teaches a method for forming a high quality silicon thin film using chemical vapor deposition (CVD) to replace the more expensive and slower process of using molecular beam epitaxy (MBE). Sandhu controls the source gas at the substrate to provide a continuous uniform layer of silicon to simulate the MBE process. However, Sandhu does not address the use of this CVD as a bottom electrode material for DRAM capacitors.

However, there is still a strong need to provide a bottom electrode structure having low node leakage current, and to provide higher capacitance independent of the vertical structure that is built.

SUMMARY OF THE INVENTION

It is a principal object of the present invention to provide a method for making stacked storage capacitors for DRAM circuits having increased refresh cycle times and increased capacitance using a polysilicon high-temperature film for the capacitor nodes (bottom electrodes) of the DRAM cells.

It is another object of the invention to provide a polysilicon layer high-temperature film which increases the native die yield (final test yield) for DRAM devices by significantly reducing the refresh time failure ratio.

Still another object of the invention is to provide a very manufacturable process that eliminates the need for doping the capacitor bottom electrodes by ion implantation.

The method for fabricating dynamic random access memory (DRAM) cells using a polysilicon high-temperature film (HTF) starts by providing a substrate. The substrate for DRAM applications is typically composed of a single-crystal silicon that is lightly doped with a P-type dopant. Field OXide (FOX) areas are formed on and in the silicon substrate surface to surround and electrically isolate device areas in which the field effect transistors are built. The most commonly used field oxide is formed by the method of LOCal Oxidation of Silicon (LOCOS) wherein a patterned silicon nitride layer is used as an oxidation mask over the device areas, and the field oxide areas are then thermally oxidized by steam oxidation. The silicon nitride layer is removed and a thin gate oxide is thermally formed on the device areas. Next, an $N^+$ doped first polysilicon layer is deposited followed by depositing a cap insulating layer, which are patterned to form the gate electrodes on the device areas and the interconnecting word lines on the FOX for the array of DRAM cells. The cap insulating layer over the gate electrodes facilitates the formation of self-aligned node contacts, if desired, to increase circuit density on the DRAM device. The lightly doped drain areas are formed next by ion-implanting an N-type dopant adjacent to the gate electrodes, wherein the gate electrode serves as a block-out mask for the implant alignment. Next, sidewall spacers are formed on the sidewalls of the gate electrodes by depositing a conformal insulating layer and etching back anisotropically to the substrate surface in the device areas. The source/drain contact areas for the FETs are now formed adjacent to the sidewall spacers by a second ion implantation, thereby heavily doping the substrate and forming highly doped $N^+$ conductive regions, thereby completing the pass transistors in each memory cell area for the DRAM memory cells.

An insulating layer, such as a chemical vapor deposited (CVD) silicon oxide ($SiO_2$) is deposited to electrically insulate the device areas from the stacked storage capacitors that are formed next. The node contact openings are then etched in the insulating layer to one of the two source/drain contact areas of each pass transistor in the device areas (memory cell areas). The node contacts can be formed by photoresist masking and anisotropic plasma etching.

A second polysilicon high-temperature film (HTF) is deposited over the insulating layer and makes contact to the source/drain contact areas of each FET in the node contact openings. The polysilicon HTF is deposited by loading the substrate into a chemical vapor deposition reactor at room temperature (21° C.). The substrate temperature is then ramped up to at least 650° C. in a reactant gas mixture of hydrogen ($H_2$), silane ($SiH_4$), and phosphine ($PH_3$) to deposit the second polysilicon film. The capacitor bottom electrodes formed from this high-temperature deposition result in improved capacitance and increased refresh times. The method also results in improved native die yields from less than 1% to about 35%. Although the method is described for a flat stacked capacitor, it should be obvious to one skilled in the art that additional processing steps can be included to fabricate stacked capacitors having various shapes, such as fin-shaped or crown-shaped bottom electrodes. The stacked storage capacitors are now completed by depositing an interelectrode dielectric layer having a high dielectric constant on the bottom electrodes, and then depositing and patterning a heavily doped third polysilicon film to form the capacitor top electrodes. The third polysilicon film can be formed by conventional low-temperature chemical vapor deposition (CVD) or by high-temperature film (HTF) deposition.

BRIEF DESCRIPTION OF THE DRAWINGS

The objects and other advantages of this invention are best explained in the preferred embodiment with reference to the attached drawings.

DESCRIPTION OF THE PREFERRED EMBODIMENT

The principal objects and advantages of the present invention are now described for making an improved capacitor node having increased capacitance, lower leakage currents with longer refresh cycle times, resulting in native die yield (final test yield) on DRAM devices. The capacitor node is in-situ doped. Therefore, no node implant is necessary, thereby simplifying the process. It should be well understood by those skilled in the art that additional semiconductor devices can be formed on the substrate, such as P- and N-channel FETs that are commonly used for making CMOS circuits for the read/write access circuits on the periphery of the DRAM chip. Although the process is described for a simple flat stacked storage capacitor to simplify the discussion and drawings, it should also be understood that the method of this invention can be applied to other types of stacked capacitors such as fin-shaped, crown-shaped, and other shaped capacitors by including additional processing steps.

Figure 1:
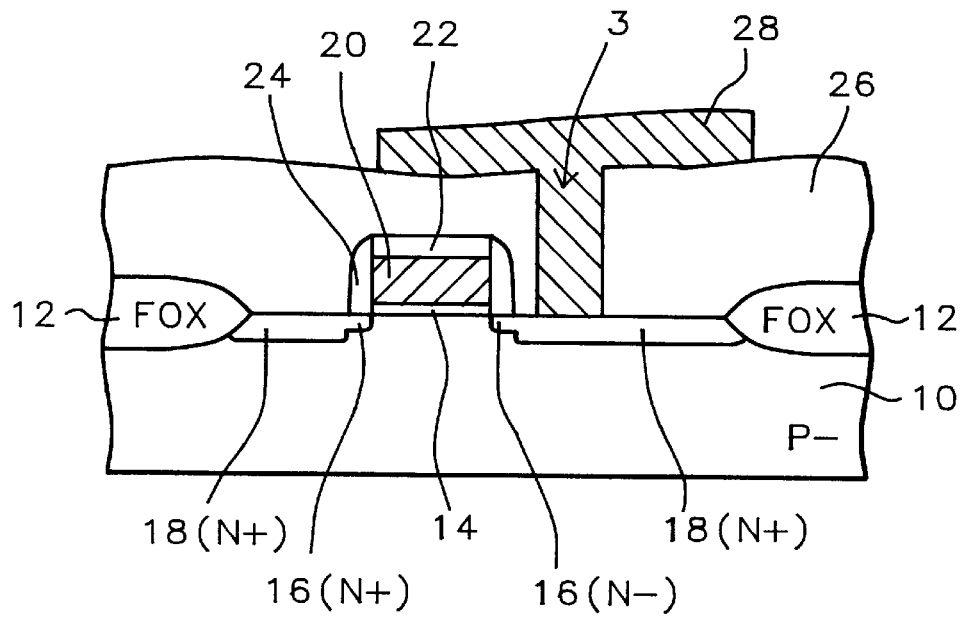
FIG. 1 is a schematic cross-sectional view through a single cell area showing a pass transistor, and a storage capacitor bottom electrode formed using a polysilicon high-temperature film deposition, by the method of this invention, having increased capacitance and longer refresh times.

Beginning with FIG. 1, a schematic cross-sectional view of a portion of a substrate 10 is shown having a partially completed dynamic random access memory (DRAM) cell on which is formed a flat stacked capacitor having an improved node contact. The most commonly used substrate for DRAMs is composed of a P-type single-crystal silicon having a <100> crystallographic orientation. A patterned, relatively thick Field OXide (FOX) 12 is formed on and in the surface of the substrate to surround and electrically isolate device areas in which the pass transistors (FETs) for the DRAM circuits are built. Only a single DRAM cell is depicted in FIG. 1, along with a portion of the field oxide 12. The method commonly practiced in the industry to form the field oxide 12 is by LOCal Oxidation of Silicon (LOCOS). The individual process steps for forming the LOCOS are not shown in the figures, but consist of depositing a thin, stress-release silicon oxide (pad oxide) layer and a thicker silicon nitride layer on the substrate 10. The silicon nitride layer is then patterned by conventional photolithography and plasma etching, leaving portions of the nitride layer over the device areas as a barrier mask to oxidation. The exposed field oxide areas are then thermally oxidized, such as by steam oxidation, to form field oxide regions 12 having a thickness of between about 2000 and 5000 Angstroms, as shown in FIG. 1. The silicon nitride masking layer and the stress-release oxide layer are removed by using, for example, a heated solution of phosphoric acid ($H_3PO_4$) to remove the nitride layer, and a dilute solution of hydrofluoric (HF) acid to remove the oxide layer.

After removing the silicon nitride layer and the stress-release oxide layer, the FETs for the array of DRAM cells are then fabricated in the device areas. Typically the transistor used in the DRAM cell is an N-channel FET and is now briefly described. The device areas on the silicon substrate surface are carefully cleaned, and a good quality thermal oxide is grown in the device areas to form a thin gate oxide 14 for the FETs, as shown in FIG. 1. Typically the gate oxide is formed by thermal oxidation in a dry oxygen ambient. Only a portion of the gate oxide 14 remains after further processing, as shown in FIG. 1. Typically the gate oxide 14 is grown to a thickness of between about 50 and 140 Angstroms.

A blanket first polysilicon layer (film) 20, with a cap oxide layer 22 on top, is deposited over the device areas and elsewhere over the field oxide areas 12, and patterned to form the FET gate electrodes 20, as shown in FIG. 1. Layer 20 is deposited by low-pressure chemical vapor deposition (LPCVD) using, for example, a reactant gas such as silane ($SiH_4$). The thickness of the first polysilicon layer 20 is in the range of between about 500 and 2500 Angstroms. Typically the first polysilicon layer 20 is heavily doped with an N-type electrically conducting dopant such as arsenic (As) or phosphorus (P) to a concentration in the range of about $1.0 \, E \, 19$ to $1.0 \, E \, 21$ atoms/$cm^3$. Alternatively a silicide layer, such as tungsten silicide (WSi) can be deposited on layer 20 to increase the electrical conductivity for the gate electrodes and word lines. Cap oxide layer 22 is typically composed of silicon oxide ($SiO_2$) and can be deposited by LPCVD using tetraethosiloxane ($Si(OC_2H_5)$), commonly referred to as TEOS, as the reactant gas. Layer 22 has a thickness of between about 1000 and 2000 Angstroms. After patterning the cap oxide 22 and polysilicon layer 20, an ion implantation is carried out to form lightly doped source/drain areas 16 adjacent to the gate electrodes 20. Typically, a phosphorus ion ($p^{31}$) implant is used having a dose in the range of $1.0 \, E \, 13$ to $1.0 \, E \, 14$ ions/$cm^2$, and the ion implant energy is in the range of about 20 to 40 keV. A sidewall insulating layer 24, such as $SiO_2$ or $SiO_2$ and silicon nitride ($Si_3N_4$), is then deposited over the gate electrodes 20 and the cap oxide 22, and is anisotropically etched back to form the sidewall spacers 24. Next the FETs are completed by ion implanting heavily $N^+$ doped source/drain contact areas 18 adjacent to the sidewall spacers 24. Typically an arsenic ($As^{75}$) ion implantation is used to form the heavily doped $N^+$ areas 18 having a dose in the range of about $2.0 \, E \, 15$ to $1.0 \, E \, 16$ ions/$cm^2$ and an ion implant energy of between about 20 and 70 keV.

Still referring to FIG. 1, an insulating layer 26 composed of silicon oxide ($SiO_2$) is deposited over the FET gate electrode structure consisting of patterned layers 20 22 and over the source/drain contact areas 18, and elsewhere on the substrate over the field oxide areas 12. The silicon oxide insulating layer 26 is preferably deposited by LPCVD using a reactant gas such as TEOS. The preferred thickness of the insulating layer 26 is between about 1500 and 6000 Angstroms.

Continuing with FIG. 1, conventional photolithographic techniques and anisotropic plasma etching are now used to form node contact openings 3 for the stacked capacitor in the insulating layer 26 over one of the two source/drain contact areas 18 of each FET in each of the DRAM memory cells. Only one of the openings 3 is depicted in FIG. 1 to simplify the drawing and the discussion.

Referring still to FIG. 1, a second polysilicon high-temperature film (HTF) 28 is deposited by the method of this invention over the insulating layer 26, and makes electrical contact to the source/drain contact areas 18 of each FET in the node contact opening 3. Layer 28 is deposited to a thickness sufficient to fill node contact opening 3, and preferably to a thickness of between about 200 and 1500 Angstroms. Preferably the polysilicon HTF is deposited by LPCVD at a temperature of at least 600° C., and more specifically in a temperature range of 600 to 700° C. This provides a much improved capacitor node contact to the source/drain contact area 18, which reduces the leakage current and thereby increases the refresh cycle time. More specifically, the polysilicon HTF 28 can be deposited in an LPCVD reactor, such as Model Applied HTF, manufactured by Applied Materials of Calif., U.S.A. The substrate is loaded in the CVD reactor at room temperature (21° C.), and then the substrate is inserted into the hot zone of the reactor to raise the substrate temperature up to at least 600° C. in a reactant gas mixture of hydrogen ($H_2$), silane ($SiH_4$), and phosphine ($PH_3$) to deposit the second polysilicon film. The gas flow rates are adjusted to provide a phosphorus dopant concentration in layer 28 of between about $1.0 \, E \, 19$ and $9.0 \, E \, 20$ atoms/cm$^3$. This eliminates an ion implantation processing step to dope layer 28, and therefore simplifies the process. Layer 28 is then patterned to form the bottom electrodes 28 (FIG. 1) for a flat stacked capacitor. Additional process steps can be included to form stacked capacitors having increased area, such as crown-shaped and fin-shaped capacitors.

Figure 2:
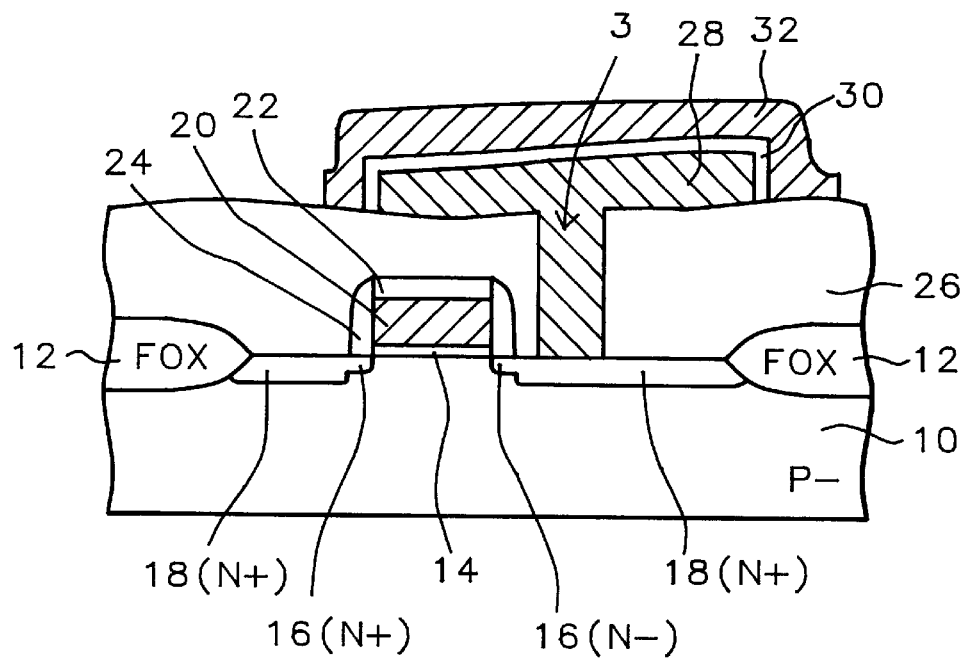
FIG. 2 shows a cross-sectional view of a completed DRAM cell that includes an interelectrode dielectric layer and a capacitor top electrode.

Referring to Fig. 2, the stacked storage capacitor for the DRAM cell is now completed by forming an interelectrode dielectric layer 30 having a high dielectric constant on the bottom electrodes. For example, layer 30 can be formed by thermally oxidizing the bottom electrode and depositing a nitride to form a $SiO_2/Si_3N_4$ (ON), or alternatively the $Si_3N_4$ can be further oxidized to form $SiO_2/Si_3N_4/SiO_2$ (ONO). Typically the interelectrode dielectric layer is between about 30 and 100 Angstroms. A heavily doped third polysilicon layer 32 is then deposited and patterned to form the top electrode. Layer 32, for example, can also be deposited by high-temperature film (HTF) deposition by the method of this invention, or by more conventional CVD methods. The thickness of layer 32 is preferably between about 200 and 1500 Angstroms, and is doped with phosphorus to a concentration of between about $1.0 \, E \, 19$ and $9.0 \, E \, 20$ atoms/cm$^3$. Layer 32 is patterned by anisotropic plasma etching in a reactive ion etcher (RIE) using a selective etching gas containing a chlorine species.

To better understand the advantages of this invention, Table I shows a comparison of the capacitor characteristics between the polysilicon HTF process (Col. 1) and capacitors using the more conventional doped polysilicon using ion implantation (Col. 2). Row 1 shows the improved cell capacitance, which is between about 25.6 and 26 femtoFarads per cell (fF/cell) for the HTF process, compared to 23.7 fF/cell for ion implanted doped polysilicon. Row 2 shows the improvement in native die yield (final yield) of 22 to 35% resulting from the longer refresh cycle times for the HTF process (Col. 1), compared to a final yield of 3% for the conventional process (Col. 2) using ion implanted polysilicon. Row 3 shows the improved refresh cycle time of 80 milliseconds (msec) for the HTF process versus only 50 msec for the conventional process. Row 4 shows the improved yield of greater than 90% for the HTF process versus a yield of 65 to 73% for the conventional process when laser repair is used to blow fuses and thereby to remove the bad row or column and replace it with a redundant row or column.

TABLE I

| row | column 1<br>HTF Processed Wafers | column 2<br>Implanted Wafers |
|---|---|---|
| 1 | 25 fF/cell<br>(max. 26 fF/cell) | 23.7 fF/cell |
| 2 | 22% (max. 26%) | 3% |
| 3 | 80 msec. | 50 msec. |
| 4 | >90% | 65% to 73% |

Figure 3:
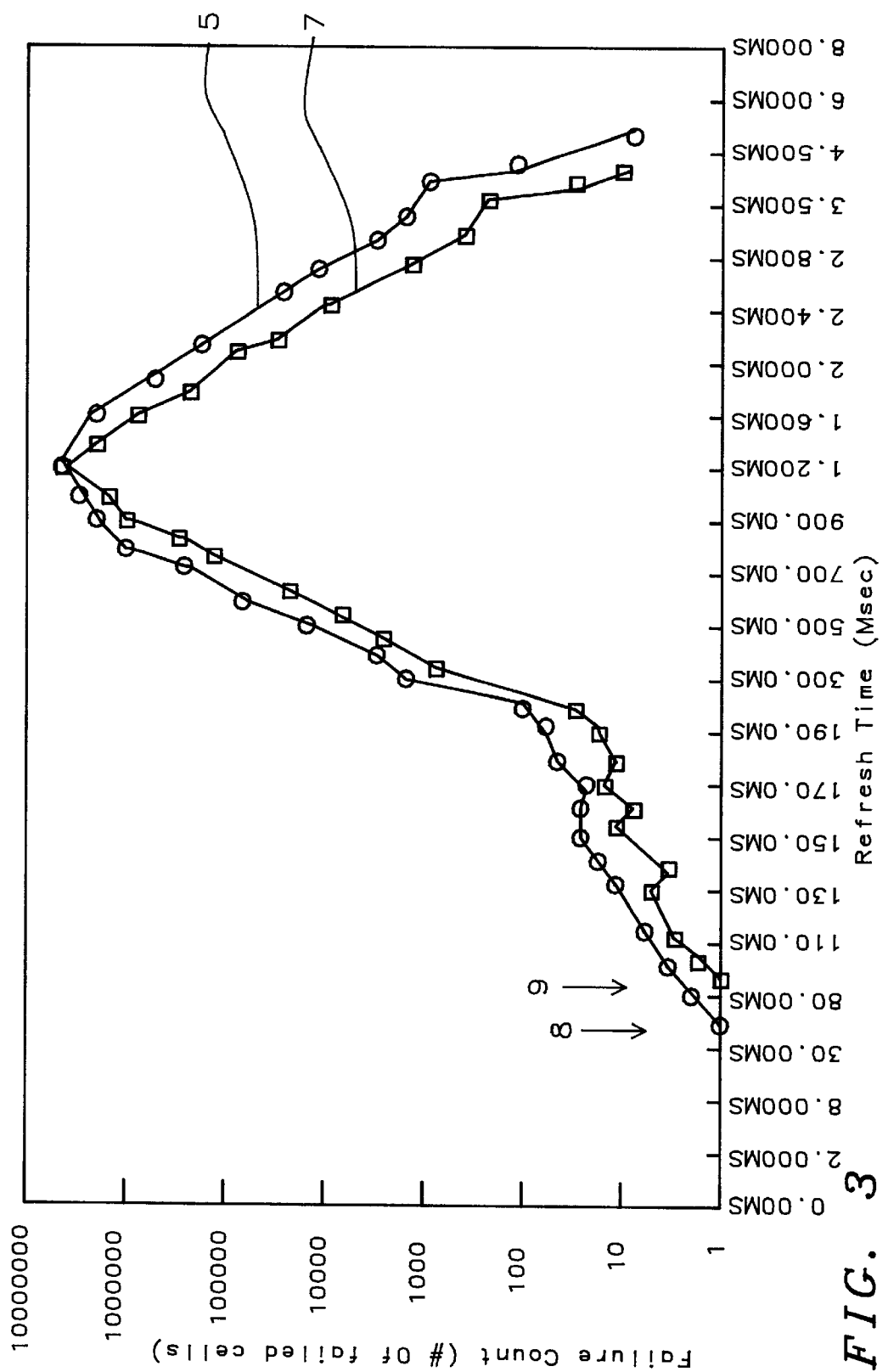
FIG. 3 shows a graph of the failure rates versus refresh cycle times for both the conventional furnace polysilicon process and the polysilicon high-temperature film process.

To better appreciate the advantages of the invention, FIG. 3 shows a log-normal plot of the number of failed memory cells as a function of the refresh cycle time for the conventional process (curve 5), and for the HTF process of this invention (curve 7). As is clearly seen the HTF process has a minimum refresh time of 80 msec. (vertical arrow 9). While the more conventional implant process has a shorter refresh time of about 50 msec.(vertical arrow 8). This translates into a higher final die yield for the HTF process of >90% compared to a yield of 65 to 73% for the conventional process at a compliance value of 65 msec. The compliance value for the refresh time is based on a 80% discharge of the capacitors.

Figure 4:
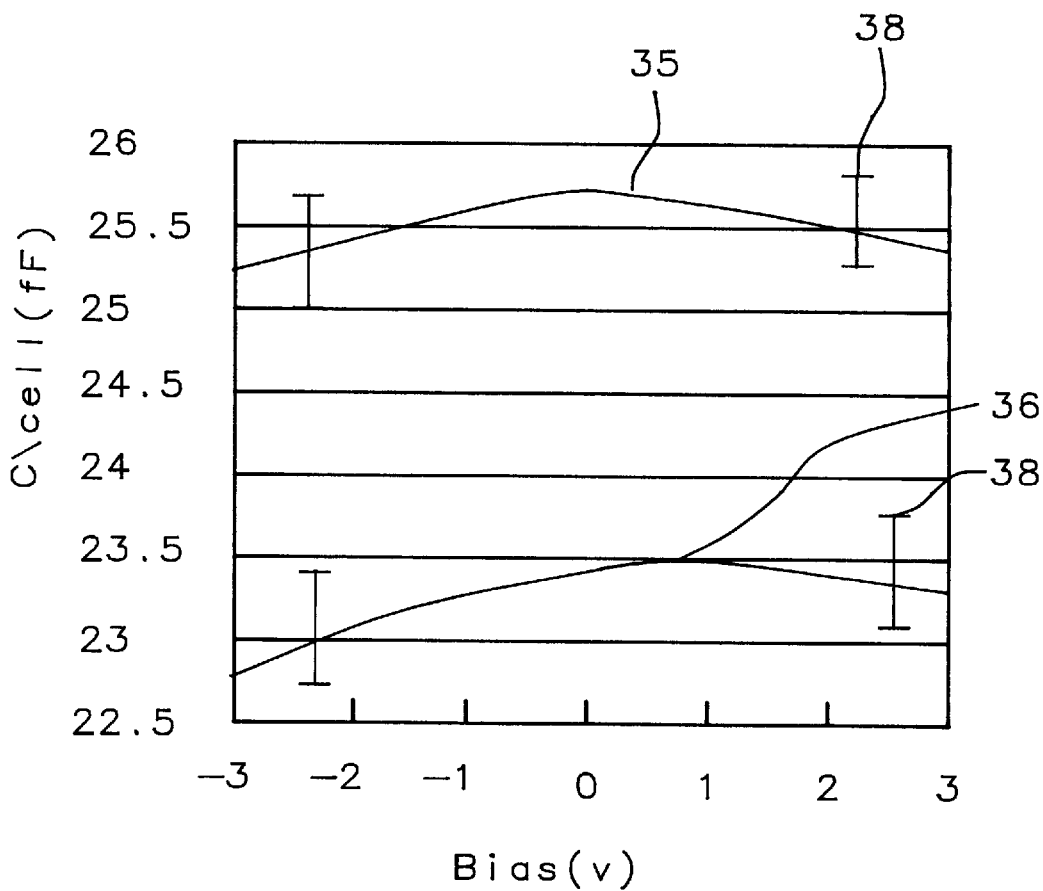
FIG. 4 is a graph of the capacitance per memory cell measured in femtoFarads (fF) as a function of voltage bias between the capacitor top and bottom electrodes for a conventional ion-implanted polysilicon process and for the polysilicon high-temperature film process using in-situ doping.

FIG. 4 is a plot of the capacitance per cell (fF) versus the bias in volts across the capacitor. As is clearly seen, the capacitance (curve 35) for the HTF process is greater than the capacitance (curve 36) for the implant process; and the change in capacitance (delta C) between 0 and −2 volts is only 0.98% for the HTF process, while the change for the conventional process is 1.49%. The vertical error bars 38 show the maximum spread in the capacitance measurements for both curves 35 and 36.

While the invention has been particularly shown and described with reference to the preferred embodiment thereof, it will be understood by those skilled in the art that various changes in form and detail may be made without departing from the spirit and scope of the invention.

What is claimed is:

1. A method for making node contacts for storage capacitors on dynamic random access memory (DRAM) devices comprising the steps of:

provided a silicon substrate with field oxide areas surrounding and electrically isolating device areas, and said device areas having field effect transistor (FET) gate electrodes formed from a first polysilicon film, each FET having two source/drain contact areas;

depositing an insulating layer over said substrate;

etching contact openings in said insulating layer to one of said source/drain contact areas of each said field effect transistor using a photoresist mask and anisotropic plasma etching thereby providing node contact openings for capacitor bottom electrodes;

depositing a second polysilicon high-temperature film (HTF) over said insulating layer and making electrical node contacts to said source/drain contact areas in said node contact openings;

forming said capacitor bottom electrodes from said second polysilicon high-temperature film thereby reducing leakage current of said node contacts and increasing node capacitance.

2. The method of claim 1, wherein said first polysilicon film has a thickness of between about 200 and 1000 Angstroms.

3. The method of claim 1, wherein said insulating layer is deposited by low pressure chemical vapor deposition (LPCVD) using tetraethosiloxane (TEOS).

4. The method of claim 1, wherein said second polysilicon high-temperature film has a thickness of between about 200 and 1000 Angstroms.

5. The method of claim 1, wherein said second polysilicon high-temperature film is deposited by inserting said substrate in a chemical vapor deposition (CVD) reactor at room temperature and ramped to a temperature between about 590 and 700° C. for a time of between about 10 and 60 seconds.

6. The method of claim 1, wherein said second polysilicon high-temperature film is deposited using a reactant gas mixture of hydrogen ($H_2$), silane ($SiH_4$), and phosphine ($PH_3$).

7. The method of claim 6, wherein said second polysilicon film is in-situ doped with said phosphine to a phosphorus concentration of between about 1.0 E 19 and 9.0 E 20 atoms/cm$^3$.

8. The method of claim 1, wherein said second polysilicon high-temperature film results in a refresh cycle time increase of between about 50 and 70% over storage capacitors having comparable surface areas.

9. The method of claim 1, wherein said second polysilicon high-temperature film results in a capacitance increase of between about 8 and 10%.

10. The method of claim 1, wherein said second polysilicon high-temperature film results in a final test yield of between about 22 and 35% compared to about 3% for storage capacitors built by conventional doped polysilicon processes.

11. A method for making an array of dynamic random access memory (DRAM) cells having improved capacitor node contacts comprising the steps of:

providing a silicon substrate with field oxide areas surrounding and electrically isolating device areas, and each said device area having a field effect transistor (FET) gate electrode formed from a first polysilicon film, each said FET having two source/drain contact areas;

depositing an insulating layer over said substrate;

etching contact openings in said insulating layer to one of said source/drain contact areas of each said field effect transistor using a photoresist mask and anisotropic plasma etching thereby providing node contact openings for capacitor bottom electrodes;

depositing a second polysilicon high-temperature film (HTF) over said insulating layer and making electrical node contacts to said source/drain contact areas in said node contact openings;

forming said capacitor bottom electrodes from said second polysilicon high-temperature film thereby reducing leakage current of said node contacts and increasing node capacitance;

depositing an interelectrode dielectric layer on said capacitor bottom electrodes;

depositing and patterning a third polysilicon film over said interelectrode dielectric layer thereby completing said array of DRAM cells.

12. The method of claim 11, wherein said first polysilicon film has a thickness of between about 200 and 1000 Angstroms.

13. The method of claim 11, wherein said insulating layer is deposited by low pressure chemical vapor deposition (LPCVD) using tetraethosiloxane (TEOS).

14. The method of claim 11, wherein said second polysilicon high-temperature film has a thickness of between about 200 and 1000 Angstroms.

15. The method of claim 11, wherein said second polysilicon high-temperature film is deposited by inserting said substrate in a chemical vapor deposition (CVD) reactor at room temperature and ramped to a temperature between about 590 and 700° C. for a time of between about 10 and 60 seconds.

16. The method of claim 11, wherein said second polysilicon high-temperature film is deposited using a reactant gas mixture of hydrogen ($H_2$), silane ($SiH_4$), and phosphine ($PH_3$).

17. The method of claim 16 wherein said phosphine in-situ dopes said second polysilicon film to a concentration of between about 1.0 E 19 and 9.0 E 20 atoms/cm$^3$.

18. The method of claim 11, wherein said second polysilicon high-temperature film results in a refresh cycle time increase of between about 50 and 70% over storage capacitors having comparable surface areas.

19. The method of claim 11, wherein said second polysilicon high-temperature film results in a capacitance increase of between about 8 and 10%.

20. The method of claim 11, wherein said second polysilicon high-temperature film results in a final test yield of between about 22 and 35% compared to about 3% for storage capacitors built by conventional doped polysilicon processes.

21. The method of claim 11, wherein said interelectrode dielectric layer is composed of silicon oxide, silicon nitride, and silicon oxide (ONO) and is deposited to a thickness of between about 1500 and 6000 Angstroms.

22. The method of claim 11, wherein said third polysilicon film is an N$^+$ conductively doped high-temperature film (HTF) and having a thickness of between about 200 and 1500 Angstroms.

* * * * *